United States Patent
Shen et al.

(10) Patent No.: US 12,506,031 B2
(45) Date of Patent: Dec. 23, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Songmei Shen, Hefei (CN); Junyi Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 450 days.

(21) Appl. No.: 18/156,470

(22) Filed: Jan. 19, 2023

(65) Prior Publication Data

US 2023/0154787 A1 May 18, 2023

Related U.S. Application Data

(63) Continuation of application No. PCT/CN2022/070591, filed on Jan. 6, 2022.

(30) Foreign Application Priority Data

Aug. 5, 2021 (CN) .................. 202110894824.8

(51) Int. Cl.
*H01L 21/768* (2006.01)
*H01L 21/306* (2006.01)
(Continued)

(52) U.S. Cl.
CPC .. *H01L 21/76802* (2013.01); *H01L 21/30604* (2013.01); *H01L 21/76831* (2013.01);
(Continued)

(58) Field of Classification Search
CPC ......... H01L 21/76802; H01L 21/30604; H01L 21/76831; H01L 21/76832; H01L 23/528; H01L 23/53204
See application file for complete search history.

(56) References Cited

U.S. PATENT DOCUMENTS

| 7,405,099 B2 | 7/2008 | Gogoi |
| 9,269,613 B2 | 2/2016 | Zhao |

(Continued)

FOREIGN PATENT DOCUMENTS

| CN | 102376684 A | 3/2012 |
| CN | 102376684 B | 4/2016 |

(Continued)

OTHER PUBLICATIONS

IP.COM word and data search (Year: 2025).*
Espace word and data search (Year: 2025).*

*Primary Examiner* — Zandra V Smith
*Assistant Examiner* — Andre C Stevenson
(74) *Attorney, Agent, or Firm* — Syncoda LLC; Feng Ma

(57) ABSTRACT

A method for manufacturing a semiconductor structure includes the following operations. A support layer and a first dielectric layer that are stacked are formed on the substrate, in which first trenches are formed in the support layer and the first dielectric layer. A first blocking layer covering sidewalls and bottoms of the first trenches and a top surface of the first dielectric layer is formed. The first blocking layer and the first dielectric layer are etched to form etching holes. The first dielectric layer exposed by the etching holes is removed to form cavities. A second blocking layer is formed, which seals the etching holes at the tops of the cavity. Part of the first blocking layer in the first trenches is removed so that the first trenches expose the substrate. Wires are formed in the first trenches.

13 Claims, 7 Drawing Sheets

(51) Int. Cl.
    *H01L 23/528*     (2006.01)
    *H01L 23/532*     (2006.01)

(52) U.S. Cl.
    CPC ...... *H01L 21/76832* (2013.01); *H01L 23/528* (2013.01); *H01L 23/53204* (2013.01)

(56) References Cited

U.S. PATENT DOCUMENTS

| | | |
|---|---|---|
| 2007/0026636 A1 | 2/2007 | Gogoi |
| 2014/0138835 A1 | 5/2014 | Zhao |
| 2022/0085151 A1* | 3/2022 | Wu ........................ H10B 12/50 |
| 2022/0285268 A1* | 9/2022 | Lee ................... H01L 21/76885 |
| 2023/0162981 A1* | 5/2023 | Yu ....................... H10B 12/033 |
| | | 438/653 |

FOREIGN PATENT DOCUMENTS

| | | |
|---|---|---|
| CN | 207409478 U | 5/2018 |
| CN | 208655630 U | 3/2019 |
| CN | 113539955 A | 10/2021 |

\* cited by examiner

SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/070591, filed on Jan. 6, 2022, which claims priority to Chinese Patent Application No. 202110894824.8, filed on Aug. 5, 2021. International Application No. PCT/CN2022/070591 and Chinese Patent Application No. 202110894824.8 are incorporated herein by reference in their entireties.

BACKGROUND

With the development of semiconductor technology, the integration level of semiconductor devices on the chip is increasing, and the spacing between various semiconductor devices is shrinking, so that the spacing between adjacent conductive devices (such as wires) in a semiconductor device is also shrinking. Referring to FIG. 1, two adjacent wires 80 and an insulating material 97 located between the wires 80 form a parasitic capacitance which is proportional to the dielectric constant of the insulating material 97 and is inversely proportional to the distance between the two wires 80. With the shrinkage in the spacing between the wires 80, the parasitic capacitance increases continuously, this leads to the capacitance-resistance delay (RC delay) of the electrical signal on the chip, and affects the operation frequency of the chip.

In the related art, an insulating material with low dielectric constant (low-k) is usually used to reduce the parasitic capacitance. However, the insulating material with low dielectric constant is prone to over-etching, and the electrical performance of the semiconductor structure is poor, and the stability of the semiconductor structure is poor.

SUMMARY

In view of the above problems, embodiments of the disclosure provides a semiconductor structure and a method for manufacturing the same, to reduce the parasitic capacitance of the semiconductor structure, and improve the electrical performance and stability of the semiconductor structure.

In order to achieve the above purposes, the embodiments of the disclosure provide the following technical solutions.

In the first aspect, an embodiment of the disclosure provides a method for manufacturing a semiconductor structure, which includes the following operations. A support layer is formed on a substrate, and a first dielectric layer is formed on the support layer, in which the support layer and the first dielectric layer are formed with first trenches, and the first trenches expose the substrate.

A first blocking layer is formed, which covers sidewalls and bottoms of the first trenches and a top surface of the first dielectric layer.

The first blocking layer and the first dielectric layer are etched to form etching holes.

The first dielectric layer exposed by the etching holes is removed to form cavities.

A second blocking layer is formed on the first blocking layer, in which the second blocking layer seals the etching holes on tops of the cavities.

Part of the first blocking layer in the first trenches is removed to allow the first trenches to expose the substrate.

Wires are formed in the first trenches, in which the wires are electrically connected with the substrate.

In the second aspect, an embodiment of the disclosure provides a semiconductor structure, which include a substrate, and a support structure arranged on the substrate, in which the support structure is provided with a plurality of accommodating trenches penetrating the support structure, each of the accommodating trenches is filled with a wire, and the wire is electrically connected with the substrate. Herein, the support structure located between adjacent wires includes a support layer, a first blocking layer and a second blocking layer. The support layer is arranged on the substrate; the first blocking layer is covered outside the support layer, in which the first blocking layer and the support layer form a cavity, the inner sidewalls of the first blocking layer are attached to the outer sidewalls of the support layer, and the first blocking layer is provided with a first etching hole communicated with the cavity; the second blocking layer is covered outside the first blocking layer, in which the inner surface of the second blocking layer is attached to the outer surface of the first blocking layer.

DETAILED DESCRIPTION

The disclosure relates to the technical field of semiconductors, in particular to a semiconductor structure and a method for manufacturing the same.

In order to reduce the parasitic capacitance of a semiconductor structure, and improve the electrical performance and stability of the semiconductor structure, the embodiments of the disclosure provides a method for manufacturing a semiconductor structure, in which a closed cavity is formed in the structure between wires, since the dielectric constant of air is 1, the dielectric constant of the structure between the wires is reduced, thereby reducing the parasitic capacitance between the wires and further improving the electrical performance of the semiconductor structure. In addition, the bottom of the cavity is a support layer, and the support layer supports the first blocking layer and the second blocking layer on the support layer, so that the depth of the cavity is reduced while ensuring the height of the wires, thereby reducing the collapse risk of the first blocking layer and the second blocking layer, and further improving the stability of the semiconductor structure.

In order to explain the above objects, features and advantages of the embodiments of the present disclosure more obvious and understandable, a clear and complete description of the technical solutions of the embodiments of the disclosure will be provided below in combination with the drawings in the embodiments of the disclosure. It is apparent that the described embodiments are only a part of the embodiments of the disclosure, not all of them. Based on the embodiments in the disclosure, any other embodiments obtained by those of ordinary skill in the art without making creative effort falls within the protection scope of the disclosure.

Embodiment 1

Figure 1:
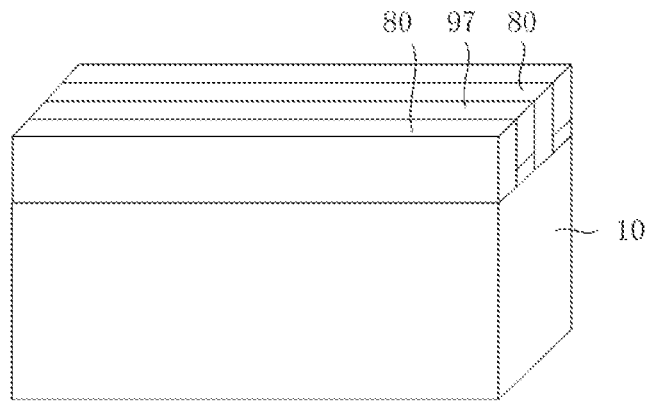
FIG. 1 is a schematic structural diagram of a semiconductor structure in the related art.
Figure 2:
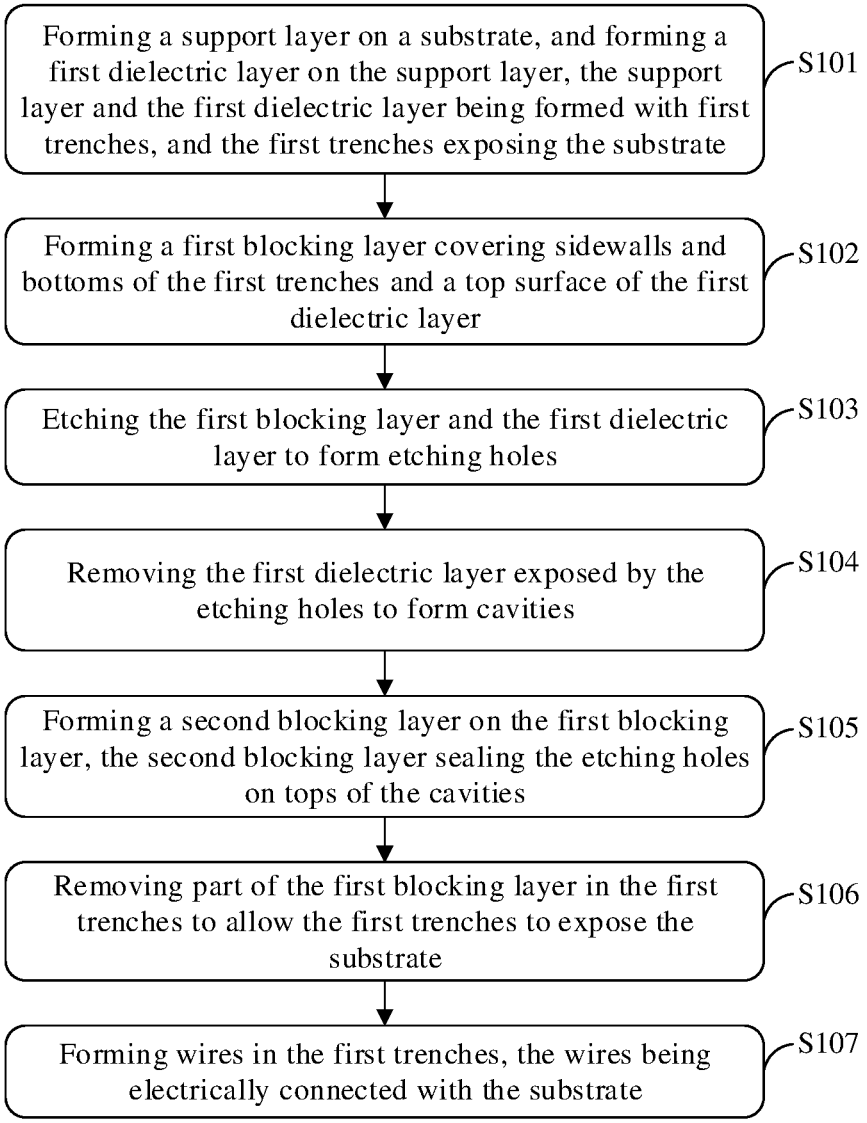
FIG. 2 is a flow chart of a method for manufacturing a semiconductor structure in embodiments of the disclosure.

Referring to FIG. 2, the embodiments of the disclosure provides a method for manufacturing a semiconductor structure which includes the following operations.

In S101, a support layer is formed on a substrate, and a first dielectric layer is formed on the support layer, in which the support layer and the first dielectric layer are formed with first trenches, and the first trenches expose the substrate.

Figure 3:
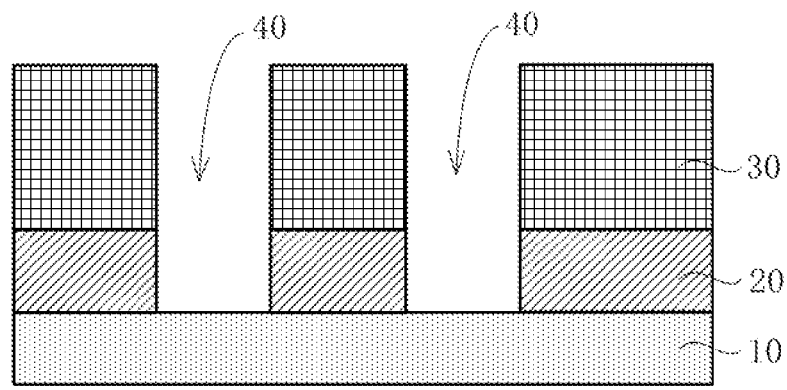
FIG. 3 is a schematic diagram of a structure after forming first trenches in embodiments of the present disclosure.

Referring to FIG. 3, the substrate 10 provides support, a material of the substrate is at least of semiconductor materials such as silicon, germanium, silicon germanium, silicon carbide, silicon on insulator (SOI), or germanium on insulator (GOI). Semiconductor devices (not shown) are generally provided on the substrate 10 to perform specific functions. The semiconductor devices may include at least one of a resistor, a capacitor, a diode, a triode, a field effect transistor (FET), a fuse, or a wire.

The support layer 20 is formed on the substrate 10. For example, the support layer 20 is formed on the substrate 24 by a process such as chemical vapor deposition (CVD), physical vapor deposition (PVD) or atomic layer deposition (ALD), or the like, so that the formed support layer 20 has good compactness and flatness.

The first dielectric layer 30 is formed on the support layer 20. The first dielectric layer 30 may be formed on the support layer 20 by deposition. There may be a lager selective ratio between the first dielectric layer 30 and the support layer 20, for example, the selective ratio of the first dielectric layer 30 to the support layer 20 is greater than or equal to 2. With this arrangement, the support layer 20 can also serve as an etch stop layer when the first dielectric layer 30 is subsequently removed to prevent damage to the substrate 10 and/or semiconductor devices on the substrate 10 when the first dielectric layer 30 is etched.

The first trenches 40 are formed in the support layer 20 and the first dielectric layer 30. As shown in FIG. 3, the first trenches 40 penetrate the support layer 20 and the first dielectric layer 30 to expose the substrate 10, and wires 80 are subsequently formed in the first trenches 40 (refer to FIG. 18). It could be understood that the sum of the thickness of the support layer 20 and the thickness of the first dielectric layer 30 is the height of the wire 80. The first dielectric layer 30 is subsequently removed, and cavities 60 are subsequently formed in these areas. The dielectric constant of air in the cavity 60 is 1, which is the lowest, so that the parasitic capacitance between two wires 80 is reduced.

The dielectric constant of the support layer 20 may be lower than that of the first dielectric layer 30. The overall dielectric constant of the support layer 20 and the first dielectric layer 30 can be further reduced by replacing part of the first dielectric layer 30 with the support layer 20 with a lower dielectric constant. For example, the first dielectric layer 30 may be a silicon oxide layer and the support layer 20 may be a hydrosilicate polymer layer, a porous silicide layer or the like. Certainly, the dielectric constant of the support layer 20 may also be higher than or equal to the dielectric constant of the first dielectric layer 30. In this case, the thickness of the support layer 20 and the thickness of the first dielectric layer 30 are adjusted, to reduce the overall dielectric constant of the support layer 20 and the subsequently formed cavity 60. Specifically, the first dielectric layer 30 is a silicon oxide layer, the support layer 20 is a silicon nitride layer or a silicon oxynitride layer, and the ratio of the thickness of the first dielectric layer 30 to the thickness of the support layer 20 is greater than or equal to 2, for example, the ratio of the thickness of the first dielectric layer 30 to the thickness of the support layer 20 is equal to 3. The above silicon oxide layer may be formed by decomposition and deposition of tetraethoxysilane (TEOS), and the above silicon oxynitride layer may be formed by nitriding the silicon nitride layer.

In S102, a first blocking layer is formed, in which the first blocking layer covers sidewalls and bottoms of the first trenches and a top surface of the first dielectric layer.

Figure 4:
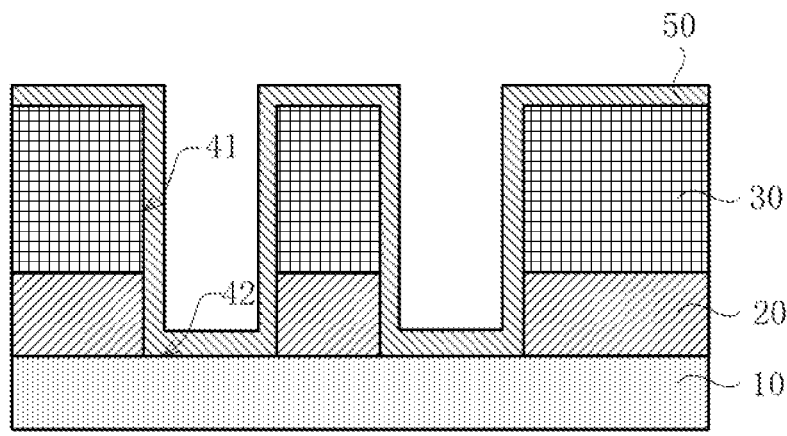
FIG. 4 is a schematic diagram of a structure after forming a first blocking layer in embodiments of the disclosure.

Referring to FIG. 4, the first blocking layer 50 is formed on the sidewalls 41 and bottoms 42 of the first trenches 40 and the top surface of the first dielectric layer 30 by deposition. Herein, the top surface of the first dielectric layer 30 refers to the surface of the first dielectric layer 30 facing away from the substrate 10, i.e. the upper surface of the first dielectric layer 30 shown in FIG. 4.

In S103, the first blocking layer and the first dielectric layer are etched to form etching holes.

Figure 5:
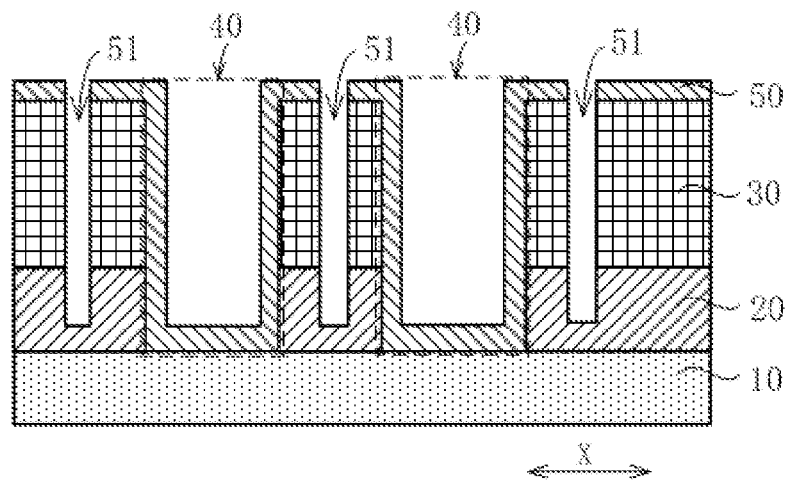
FIG. 5 is a schematic diagram of a structure after forming etching holes in embodiments of the disclosure.

Referring to FIG. 5, the etching holes 51 penetrate the first blocking layer 50 and extend into the first dielectric layer 30, so as to increase the surface area of the first dielectric layer 30 exposed by the etching holes 51, thereby facilitating subsequent removal of the first dielectric layer 30. In some possible examples, the etching holes 51 penetrate the first dielectric layer 30. Further, the etching holes 51 may extend into the support layer 20, that is, the bottoms of the etching holes 51 are located in the support layer 20. With this arrangement, air gaps are formed within the support layer 20, thereby reducing the dielectric constant of the support layer 20 and further reducing the RC delay in the semiconductor structure.

The width of the etching hole 51 may be 3-5 nm, in which the width direction of the etching hole 51 is the same as the width direction of the first trench 40, the horizontal direction (X direction) as shown in FIG. 5. With this arrangement, the etching holes 51 in the first blocking layer 50 can be easily sealed by the second blocking layer 70, and the sealing material falling into the etching holes 51 during sealing can be reduced, thereby ensuring the reduction effect of the cavity on RC delay.

Figure 6:
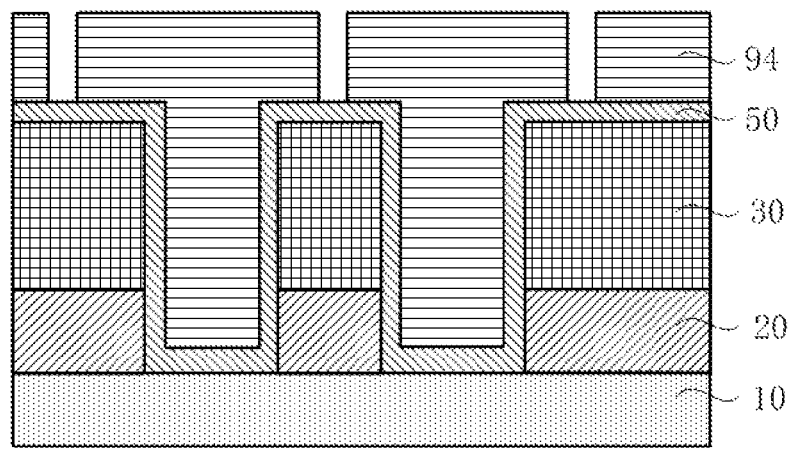
FIG. 6 is a schematic diagram of a structure after forming a second photoresist layer in embodiments of the disclosure.

In some possible examples, referring to FIG. 5 and FIG. 6, the operation of etching the first blocking layer 50 and the first dielectric layer 30 to form the etching holes 51 includes the following operations.

A second photoresist layer 94 is formed on the first blocking layer 50 and in the first trenches 40, in which the second photoresist layer 94 fills the first trenches 40 and covers a surface of the first blocking layer 50 facing away from the substrate 10. As shown in FIG. 5 and FIG. 6, the sidewalls 41 and the bottoms 42 of the first trenches 40 are covered with the first blocking layer 50, and the second photoresist layer 94 fills in the area enclosed by the first blocking layer 50 and covers the top surface of the first blocking layer 50. The second photoresist layer 94 is a patterned second photoresist layer 94, and the top surface of the second photoresist layer 94 may be flush, that is, the surface of the second photoresist layer 94 away from the substrate 10 is planar.

After the second photoresist layer 94 is formed, the first blocking layer 50 and the first dielectric layer 30 are etched by taking the second photoresist layer 94 as a mask to form the etching holes 51. As shown in FIG. 6, regions of the first blocking layer 50 and the first dielectric layer 30 that are not covered by the second photoresist layer 94 are removed and etching stops at the surface of the support layer 20 facing away from the substrate 10 or in the support layer 20. Dry etching may be adopted for etching, and the etching gas includes a fluorine-containing gas, oxygen and an inert gas (such as nitrogen or argon).

After the etching holes 51 are formed, the second photoresist layer 94 is removed. Herein, the second photoresist layer 94 may be removed by ashing. After the second photoresist layer 94 is removed, the first blocking layer 50 is exposed.

In S104, the first dielectric layer exposed by the etching holes is removed to form cavities.

Figure 7:
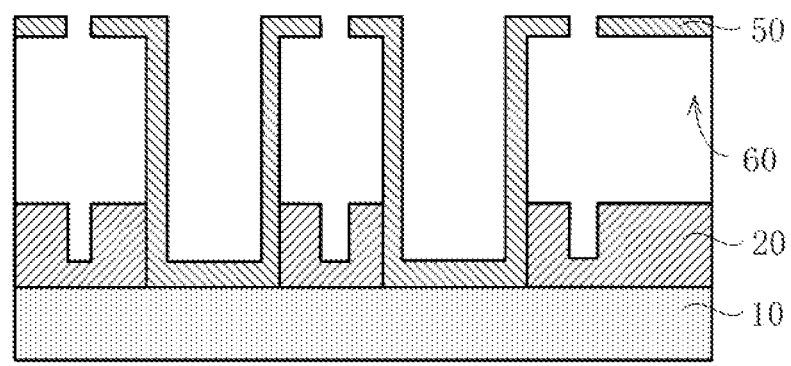
FIG. 7 is a schematic diagram of a structure after forming cavities in embodiments of the disclosure.

Referring to FIG. 7, after the first dielectric layer 30 is removed, cavities 60 are formed in areas enclosed by the first blocking layer 50 and the support layer 20, and the etching hole 51 in the first blocking layer 50 communicates with the cavity 60. For example, the first dielectric layer 30 exposed by the etching holes 51 is removed by dry etching or wet etching. The first dielectric layer 30 is removed by a reaction between the first dielectric layer 30 and an etching liquid or an etching gas. In some possible examples, the material of the first dielectric layer 30 is silicon oxide, and the etching gas may include a fluorine-containing gas such as octafluorocyclobutane ($C_4F_8$), or the etching liquid may include dilute hydrofluoric acid (DHF).

In S105, a second blocking layer is formed on the first blocking layer, in which the second blocking layer seals the etching holes on tops of the cavities.

Figure 8:
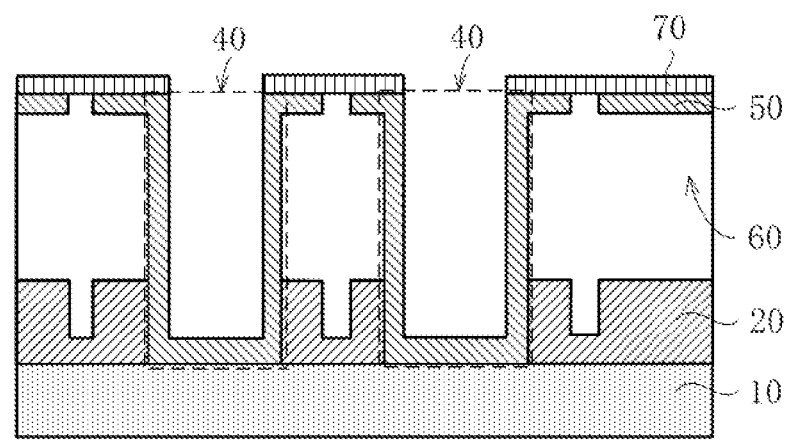
FIG. 8 is a schematic diagram of a structure after forming a second blocking layer in embodiments of the disclosure.
Figure 15:
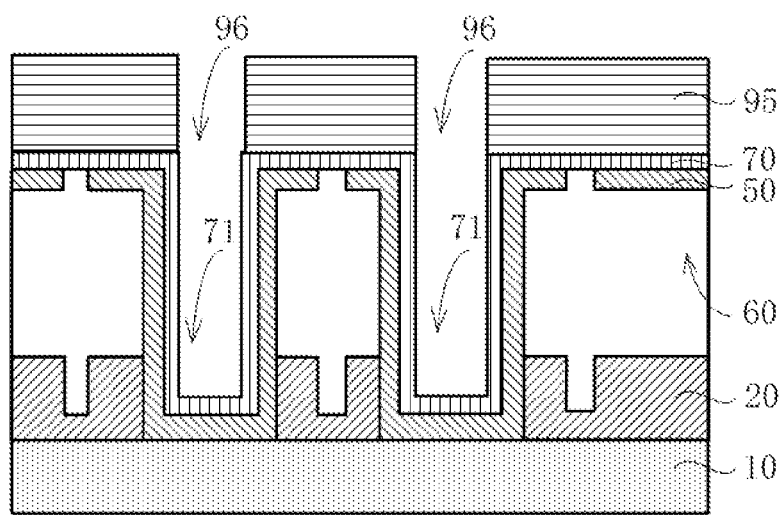
FIG. 15 is a schematic diagram of a structure after forming a third photoresist layer in embodiments of the disclosure.

Referring to FIG. 8, the second blocking layer 70 is formed on the first blocking layer 50 by deposition. The process parameter of the second blocking layer 70 such as the deposition rate, the temperature or the like is controlled such that the second blocking layer 70 seals the etching holes 51. For example, as shown in FIG. 8, the second blocking layer 70 may cover only the surface of the first blocking layer 50 facing away from the substrate 10. Certainly, as shown in FIG. 15, the second blocking layer 70 may also cover the first blocking layer 50 located in the first trenches 40.

It should be noted that, the materials of the first blocking layer 50, the second blocking layer 70 and the support layer 20 may be the same, so that the first blocking layer 50, the second blocking layer 70 and the support layer 20 form an integral structure, to prevent delamination of the area where the support layer 20 and the first blocking layer 50 contact each other and the area where the first blocking layer 50 and the second blocking layer 70 contact each other. For example, all the materials of the first blocking layer 50, the second blocking layer 70 and the support layer 20 are silicon nitride.

In S106, part of the first blocking layer in the first trenches is removed to allow the first trenches to expose the substrate.

Figure 9:
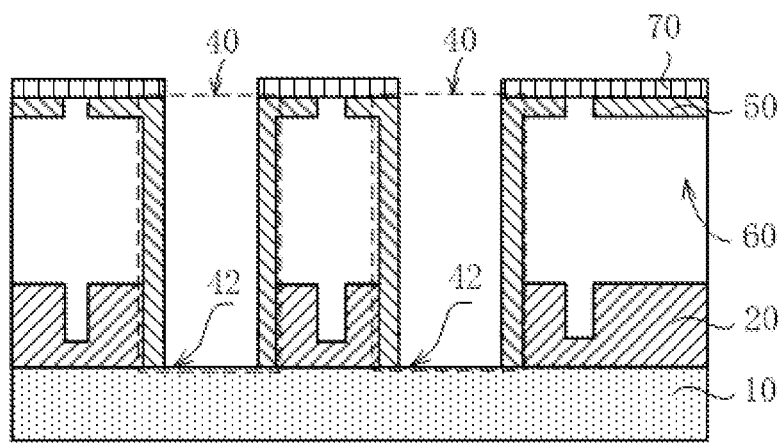
FIG. 9 is a schematic diagram of a structure after removing part of the first blocking layer in embodiments of the disclosure.

Referring to FIG. 9, the substrate 10 is exposed by removing part of the first blocking layer 50 in the first trenches 40, so that wires 80 subsequently formed in the first trenches 40 can be in contact with the substrate 10 to achieve electrical connection. For example, the first blocking layer 50 on the bottoms 42 of the first trenches 40 is removed by anisotropic etching, and the first blocking layer 50 on the sidewalls of the first trenches 40 is retained.

In S107, wires are formed in the first trenches, in which the wires are electrically connected with the substrate.

Figure 10:
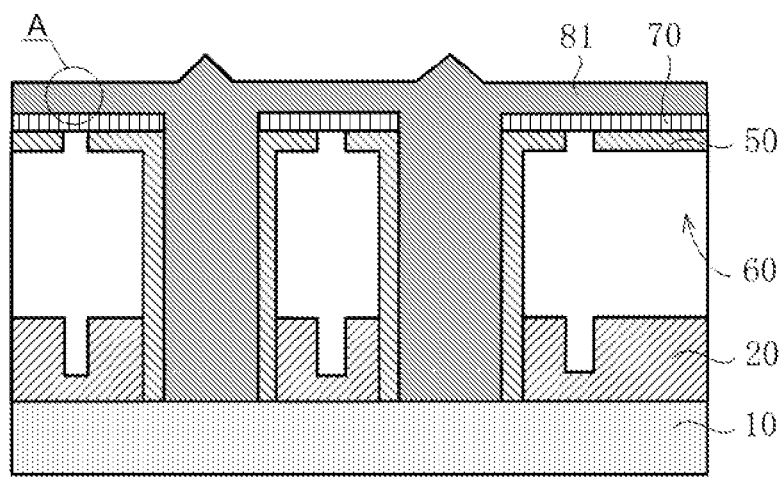
FIG. 10 is a schematic diagram of a structure after forming a conductive layer in embodiments of the disclosure.
Figure 11:
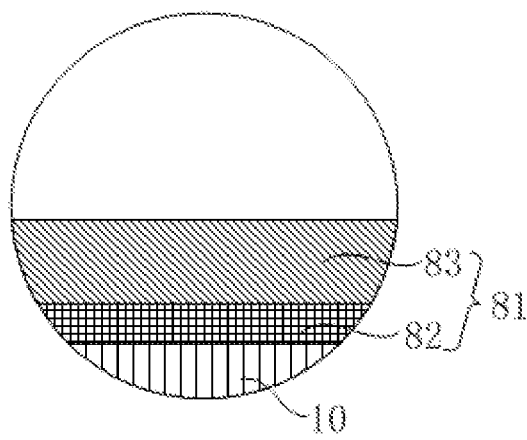
FIG. 11 is a schematic structural diagram of a conductive layer in embodiments of the disclosure.

Referring to FIG. 9 to FIG. 11, the wires are formed in the first trenches 40 and electrically connected to the substrate 10, to electrically connect the substrate 10 to other film layers, thereby enabling transmission of electrical signals in a direction perpendicular to the substrate 10. In some possible examples, the operation of forming wires in the first trenches, the wires being electrically connected with the substrate includes the following operations.

A conductive layer 81 is deposited in the first trenches 40, in which the conductive layer 81 fills the first trenches 40 and covers a top surface of the second blocking layer 70. Herein, the conductive layer 81 includes a third blocking layer 82 and a conductive material layer 83 in a stacked arrangement, and the third blocking layer 82 is located at a side of the conductive layer 81 close to the substrate 10. The third blocking layer 82 is used for reducing or preventing diffusion of the conductive material layer 83 into the first blocking layer 50, the second blocking layer 70, the support layer 20, and the substrate 10. The third blocking layer 82 includes at least one of a titanium layer, a titanium nitride layer, a tantalum layer or a tantalum nitride layer. The conductive material layer 83 may be a copper layer, a tungsten layer or the like. The process for forming the conductive layer 81 in the embodiments of the application is not limited, and for example, the conductive layer 81 may also be formed by electroplating.

After the conductive layer 81 is formed, the conductive layer 81 located on the second blocking layer 70 is removed, and the remaining conductive layer 81 forms the wires. For example, the surface of the conductive layer 81 facing away from the substrate 10 is planarized to remove the conductive layer 81 located on the second blocking layer 70. Specifically, the top surface of the conductive layer 81 is subjected to chemical mechanical polishing (CMP) to expose the second blocking layer 70.

In summary, in the method for manufacturing a semiconductor structure of the embodiment of the disclosure, a closed cavity 60 is formed in the structure between wires, and the first blocking layer 50 and the second blocking layer 70 form the upper wall and the sidewalls of the cavity 60. Since the dielectric constant of air is lower than that of the first dielectric layer 30, the dielectric constant of the structure between the wires is reduced, thereby reducing the parasitic capacitance between the wires and further improving the electrical performance of the semiconductor structure. In addition, the bottom 42 of the cavity 60 is the support layer 20, and the support layer 20 supports the first blocking layer 50 and the second blocking layer 70 on the support layer, so that the depth of the cavity 60 is reduced while ensuring the height of the wires, and the contact area of the cavity 60 with the substrate 10 is increased, thereby reducing the collapse risk of the first blocking layer 50 and the second blocking layer 70, and further improving the stability of the semiconductor structure.

Figure 12:
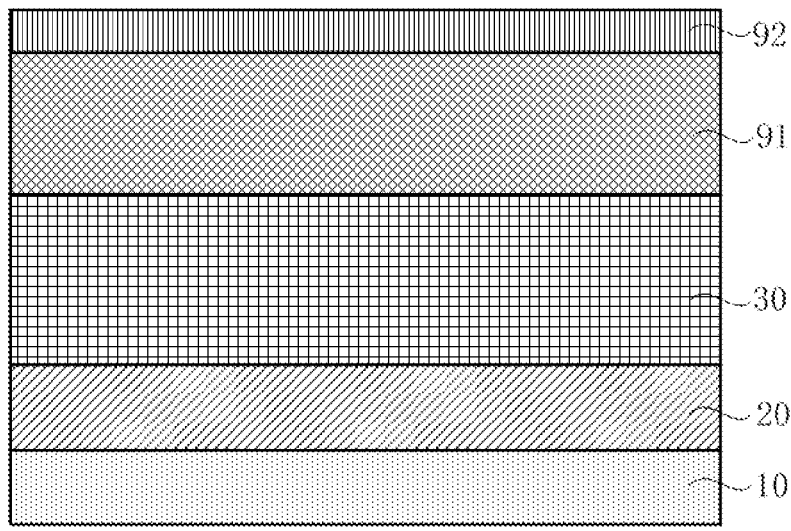
FIG. 12 is a schematic diagram of a structure after forming an anti-reflective layer in embodiments of the disclosure.
Figure 13:
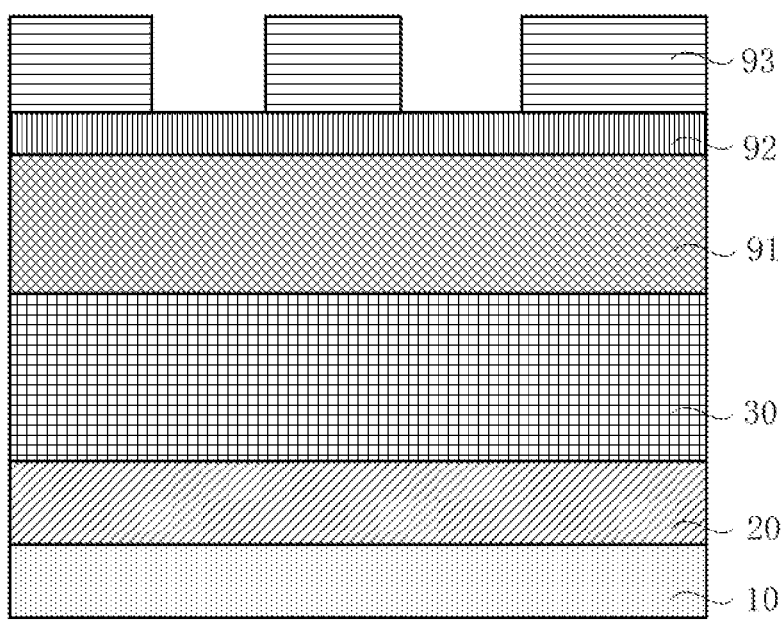
FIG. 13 is a schematic diagram of a structure after forming a first photoresist layer in embodiments of the disclosure.

Is should be noted that, in a possible example of the disclosure, referring to FIG. 3, FIG. 12 and FIG. 13, the operation of forming a support layer 20 on a substrate 10, and forming a first dielectric layer 30 on the support layer 20, the support layer 20 and the first dielectric layer 30 being formed with first trenches 40, and the first trenches 40 exposing the substrate 10 includes the following operations.

In S1021, the support layer 20, the first dielectric layer 30, a hard mask layer 91, an anti-reflective layer 92 and a first photoresist layer 93 are formed in sequence on the substrate 10.

Referring to FIG. 12 and FIG. 13, the support layer 20, the first dielectric layer 30, the hard mask layer 91, the anti-reflective layer 92 and the first photoresist layer 93 that are stacked are formed on the substrate 10. Herein, the support layer 20, the first dielectric layer 30, the hard mask layer and the anti-reflective layer 92 may be formed by deposition. Specifically, the support layer 20 is formed on the substrate 10 by deposition, the first dielectric layer 30 is formed on the support layer 20 by deposition, the hard mask layer 91 is formed on the first dielectric layer 30 by deposition, and the anti-reflective layer 92 is formed on the hard mask layer 91 by deposition. The first photoresist layer 93 may be formed by patterning. For example, the first photoresist layer 93 is formed on the anti-reflective layer 92 by spin coating; and the first photoresist layer 93 is exposed and developed to expose part of the anti-reflective layer 92 so that the first photoresist layer 93 is formed with a desired pattern.

The anti-reflective layer 92 is used for reducing standing waves when the first photoresist layer 93 is exposed and preventing light from diffuse reflection at the bottom of the first photoresist layer 93 so as to ensure the accuracy of the pattern of the first photoresist layer 93. The hard mask layer 91 is used for transferring the pattern of the first photoresist layer 93, and the material of the hard mask layer 91 is different from that of the anti-reflective layer 92. In a possible example, the material of the hard mask layer 91 is silicon nitride or silicon dioxide, the material of the anti-reflective layer 92 is silicon oxynitride, and the material of the first photoresist layer 93 may be a positive photoresist or a negative photoresist.

In S1022, the anti-reflective layer 92 and the hard mask layer 91 are etched by taking the first photoresist layer 93 as a mask.

The anti-reflective layer 92 and the hard mask layer 91 are anisotropically etched with an etching gas by taking the patterned first photoresist layer 93 as a mask. Herein, the etching gas may include carbon tetrafluoride ($CF_4$), octafluorocyclobutane ($C_4F_8$), perfluorocyclopentene($C_5F_8$) or the like.

In some possible examples, the first photoresist layer 93 is completely depleted without a residue during etching the anti-reflective layer 92 and the hard mask layer 91. In other possible examples, the first photoresist layer 93 is not completely depleted and has a residue during etching the anti-reflective layer 92 and the hard mask layer 91. At this time, the first photoresist layer 93 needs to be removed separately, for example the remaining first photoresist layer 93 is removed by ashing or etching.

In S1023, the first dielectric layer 30 and the support layer 20 are etched by taking the etched anti-reflective layer 92 and the etched hard mask layer 91 as a mask to form the first trenches 40.

The first dielectric layer 30 and the support layer 20 are etched by taking the etched anti-reflective layer 92 and the etched hard mask layer 91 as a mask to form the first trenches 40, in which the first trenches 40 penetrate the first dielectric layer 30 and the support layer 20 to expose the substrate 10. For example, the anti-reflective layer 92 and the hard mask layer 91 may be removed by dry etching, and the dry etching of the anti-reflective layer 92 may adopt carbon tetrafluoride ($CF_4$), argon (Ar) and oxygen ($O_2$) as an etching gas, and the dry etching of the hard mask layer 91 may adopt perfluorocyclopentene($C_5F_8$), argon (Ar) and oxygen ($O_2$) as an etching gas. Herein, the fluorine-containing gas (carbon tetrafluoride, octafluorocyclopentene) are the main etching gas, oxygen is mainly used to adjust the etching rate, selectivity ratio and uniformity, and argon is mainly used to reduce a loading effect. The loading effect refers to the phenomenon that the etching rate decreases with the increase of etching area.

It should be noted that, the anti-reflective layer 92 and the hard mask layer 91 are also etched during forming the first trenches 40. If the anti-reflective layer 92 or the hard mask layer 91 has a residue after the first trenches 40 are formed, the anti-reflective layer 92 and the hard mask layer 91 need to be removed. For example, the anti-reflective layer 92 and the hard mask layer 91 are removed by chemical mechanical polishing.

Figure 14:
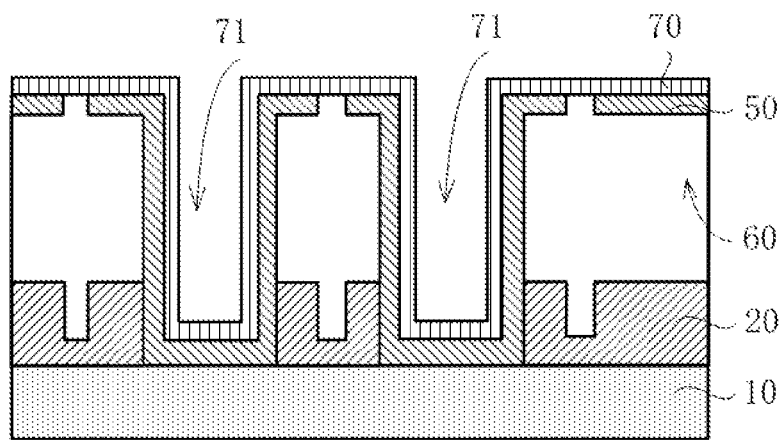
FIG. 14 is a schematic diagram of another structure after forming a second blocking layer in embodiments of the disclosure.

It should be noted that, referring to FIG. 7 and FIG. 14, in a possible example of the disclosure, the operation of forming a second blocking layer 70 on the first blocking layer 50, and the second blocking layer 70 sealing the etching holes 51 on tops of the cavities 60 includes forming the second blocking layer 70 covering the first blocking layer 50, in which the second blocking layer 70 located in the first trenches 40 encloses second trenches 71.

As shown in FIG. 7 and FIG. 14, the second blocking layer 70 covers the top surface of the first blocking layer 50 and the first blocking layer 50 in the first trenches 40, and the second blocking layer 70 located in the first trenches 40 encloses the second trenches 71. With this arrangement, the first blocking layer 50 and the second blocking layer 70 at the sidewalls of the first trenches 40 form the sidewalls of the cavities 60, which can increase the thickness of the sidewalls of the cavity 60, so as to reduce or prevent collapse of the sidewalls of the cavity 60, further improving the stability of the semiconductor structure.

Figure 16:
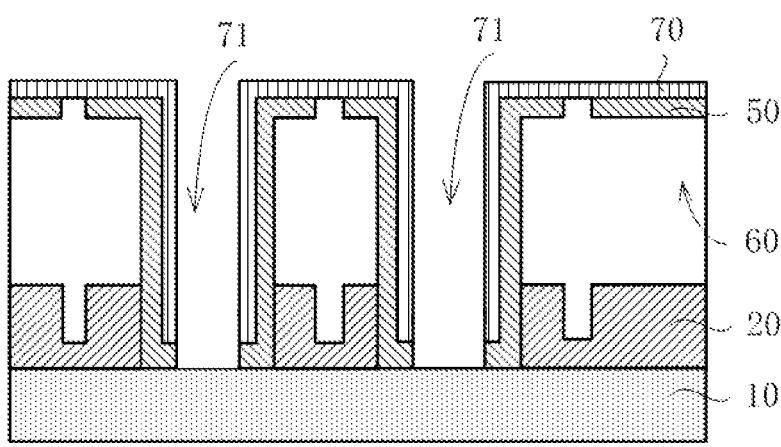
FIG. 16 is a schematic diagram of a structure after removing part of the first blocking layer and part of the second blocking layer in embodiments of the disclosure.

Accordingly, referring to FIG. 14 to FIG. 16, the operation of removing part of the first blocking layer 50 in the first trenches 40 to allow the first trenches 40 to expose the substrate 10 includes removing the second blocking layer 70 and the first blocking layer 50 at the bottoms 42 of the second trenches 71 to allow the second trenches 71 to expose the substrate 10.

As shown in FIG. 14 to FIG. 16, the second blocking layer 70 and the first blocking layer 50 are etched along the second trenches 71, so that the second trenches 71 extend to the substrate 10, and the substrate 10 is exposed by the second trenches 71. In some possible examples, the operation of removing the second blocking layer 70 and the first blocking layer 50 at the bottoms 42 of the second trenches 71, the second trenches 71 exposing the substrate 10 includes the following operation.

A third photoresist layer 95 is formed on the second blocking layer 70, in which the third photoresist layer has first openings 96, and an orthographic projection of the first openings 96 on the substrate 10 coincides with an orthographic projection of the second trenches 71 on the substrate 10. As shown in FIG. 15, the third photoresist layer 95 is formed on the top surface of the second blocking layer 70 by spin coating. The third photoresist layer 95 is a patterned third photoresist layer 95 having first openings 96, in which the first openings 96 are located directly above the second trenches 71, and the orthographic projection of the first openings 96 on the substrate 10 coincides with the orthographic projection of the second trenches 71 on the substrate 10.

After the third photoresist layer 95 is formed, the second blocking layer 70 and the first blocking layer 50 are etched by taking the third photoresist layer 95 as a mask. As shown in FIG. 15 and FIG. 16, the second blocking layer 70 and the first blocking layer 50 are dry-etched or wet-etched along the first openings 96 of the third photoresist layer 95 to expose the substrate 10. The third photoresist layer 95 is also completely removed during etching, or the remaining third photoresist layer 95 is removed by a process such as ashing after the etching is completed.

Figure 17:
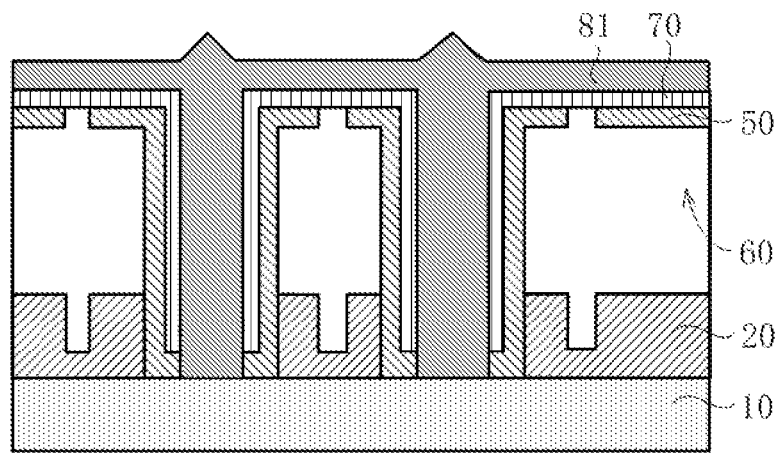
FIG. 17 is a schematic diagram of another structure after forming a conductive layer in embodiments of the disclosure.
Figure 18:
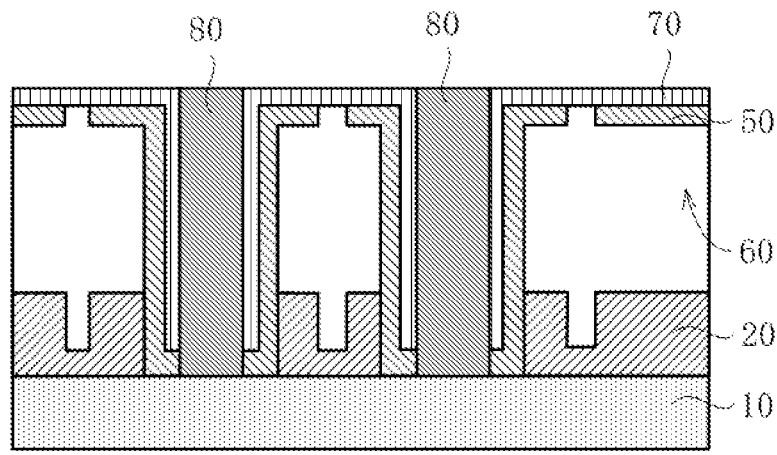
FIG. 18 is a schematic diagram of a structure after forming wires in embodiments of the disclosure.

Accordingly, referring to FIG. 17 and FIG. 18, the operation of forming wires 80 in the first trenches 40, the wires 80 being electrically connected to the substrate 10 includes forming the wires 80 in the second trenches 71, in which the wires 80 fill in the second trenches 71. For example, as shown in FIG. 17 and FIG. 18, a conductive layer 81 is formed in the second trenches 71 and on the second blocking layer 70, in which the conductive layer 81 fills the second trenches 71 and covers the surface of the second blocking layer 70 facing away from the substrate 10. As shown in FIG. 17 and FIG. 18, the conductive layer 81 on the second blocking layer 70 is further planarized so that the surface of the conductive layer 81 facing away from the substrate 10 is flush with the surface of the second blocking layer 70 facing away from the substrate 10, and the conductive layer 81 forms a plurality of wires 80 spaced apart from each other, and the wires 80 fill the second trenches 71.

Embodiment 2

The disclosure also provides a semiconductor structure. Referring to FIG. 18, the semiconductor includes a substrate 10, a support structure and wires 80. The substrate 10 provides support, which may be made of at least one of silicon, germanium, silicon germanium, silicon carbide, silicon on insulator, or germanium on insulator. The substrate is typically provided with semiconductor devices. The semiconductor devices may include at least one of a resistor, a capacitor, a diode, a triode, a field effect transistor, a fuse, or a wire.

The support structure is provided on the substrate 10 and in contact with the substrate 10. The support structure is provided with a plurality of accommodating trenches penetrating the support structure and the plurality of accommodating trenches are arranged at intervals. Each of the accommodating trenches exposes the substrate 10 so that the wire 80 filled in each of the accommodating trenched contacts with the substrate 10, thereby achieving electrical connection between the wires 80 and the substrate 10, and further electrically connecting the film layer on the support structure and the substrate 10 to achieve transmission of electrical signals in a direction perpendicular to the substrate 10.

The support structure located between two adjacent ones of wires 80 may include a support layer 20, a first blocking layer 50 and a second blocking layer 70. The support layer 20 is arranged on the substrate 10, and the first blocking layer 50 is covered outside the support layer 20. The first blocking layer 50 and the support layer 20 enclose the cavity 60, and part of the inner sidewall of the first blocking layer 50 is attached to the corresponding outer sidewall of the support layer 20. The dielectric constant of the support structure can be reduced by virtue of the dielectric constant of air which is 1, thereby reducing the parasitic capacitance between the wires 80.

The first blocking layer 50 is also provided with a first etching hole located at the top of each cavity 60 and in communication with the cavity 60, that is, the first etching holes penetrate the first blocking layer 50, for example, the first etching hole is a straight through hole. The width of the first etching hole may be 3-5 nm, and the cross-sectional shape of the first etching hole may be rectangular, square or trapezoidal, so as to facilitate manufacturing. Certainly, under different process parameters, the cross-sectional shape of the first etching hole may be other irregular patterns. The cross-sectional shape refers to a shape obtained by taking a plane perpendicular to the surface of the substrate 10 as a cross-section.

The second blocking layer 70 is covered outside the first blocking layer 50, and the inner surface of the second blocking layer 70 is attached to the outer surface of the first blocking layer 50. As shown in FIG. 18, the second blocking layer 70 seals the first etching hole 51, so that the cavity 60 forms a closed structure. In addition, the first blocking layer 50 and the second blocking layer 70 together form the sidewalls of the sidewalls of the cavity 60, which can increase the thickness of the sidewalls of the cavity 60, so as to prevent collapse of the sidewalls of the cavity 60, further improving the stability of the semiconductor structure.

The materials of the first blocking layer 50, the second blocking layer 70 and the support layer 20 may be the same, for example, all of them are silicon nitride, so that the first blocking layer 50, the second blocking layer 70 and the support layer 20 form an integral structure, to prevent delamination of the area where the support layer 20 and the first blocking layer 50 contact each other and the area where the first blocking layer 50 and the second blocking layer 70 contact each other. The ratio of the height of the cavity 60 to the thickness of the support layer 20 is greater than or equal to 2, in which the thickness of the support layer 20 is the distance between the top surface of the support layer 20 and the substrate 10, and the height of the cavity 60 is the distance between the inner upper wall of the cavity 60 and the top surface of the support layer 20.

In some possible examples, the support layer 20 is further provided with a second etching hole that is opposite and adapted to the first etching hole. The dielectric constant of the support layer 20 can be reduced by replacing part of the support layer 20 with air, which further reduces RC delay in the semiconductor structure. As shown in FIG. 18, the orthographic projection of the first etching holes on the substrate 10 coincides with the orthographic projection of the second etching holes on the substrate 10.

The wires 80 fill the accommodating trenches and the surface of the wire 80 facing away from the substrate 10 may be flush with the surface of the second blocking layer 70. The wire 80 includes a third blocking layer 82, and a conductive material layer 83 arranged on the third blocking layer 82. The third blocking layer 82 is arranged on the sidewalls and bottom 42 of the accommodating trench to reduce or prevent diffusion of the conductive material layer 83 into the substrate 10 and the second blocking layer 70. The third blocking layer 82 may include a tantalum nitride layer and a tantalum layer, in which the tantalum layer is located on a side of the tantalum nitride layer away from the third blocking layer 82. The material of the conductive material layer 83 may be copper, tungsten or the like.

In the semiconductor structure of the embodiment of the disclosure, a closed cavity 60 is provided in the support structure between two adjacent wires 80, and the first blocking layer 50 and the second blocking layer 70 form the sidewalls and the upper wall of the cavity 60. Since the dielectric constant of air is 1, the dielectric constant of the structure between the wires 80 is reduced, thereby reducing the parasitic capacitance between the wires 80 and further improving the electrical performance of the semiconductor structure. In addition, the bottom 42 of the cavity 60 is the support layer 20, and the support layer 20 supports the first blocking layer 50 and the second blocking layer 70 on the support layer, so that the depth of the cavity 60 is reduced while ensuring the height of the wires 80, thereby reducing the collapse risk of the first blocking layer 50 and the second blocking layer 70, and further improving the stability of the semiconductor structure.

Various examples and embodiments in this specification are described in a progressive manner and each embodiment focuses on differences from other embodiments. Same and similar parts between the embodiments can be referred to each other.

In the description of the specification, the reference terms "one embodiment", "some embodiments", "illustrative embodiments", "example", "specific example", "some examples" or the like refer to that specific features, structures, materials, or characteristics described in combination with the embodiment or example are included in at least one embodiment or example of the disclosure. In this specification, illustrative representations of the above terms do not necessarily refer to the same embodiments or examples. Further the described specific features, structures, materials or characteristics may be combined in a suitable manner in any one or more embodiments or examples.

Finally, it should be noted that, the above embodiments are only used to illustrate the technical solution of the present disclosure, not limitation; although the present disclosure has been described in detail with reference to the preceding embodiments, it should be understood by those of ordinary skill in the art that the technical solution described in the preceding embodiments can still be modified or some or all of the technical features thereof can be equivalently replaced; while these modifications or replacements are not intended to make the nature of the corresponding technical solution depart from the scope of the technical solution of the embodiments of the present disclosure.

What is claimed is:

1. A method for manufacturing a semiconductor structure, comprising:
    forming a support layer on a substrate, and forming a first dielectric layer on the support layer, the support layer and the first dielectric layer being formed with first trenches, and the first trenches exposing the substrate;
    forming a first blocking layer covering sidewalls and bottoms of the first trenches and a top surface of the first dielectric layer;
    etching the first blocking layer and the first dielectric layer to form etching holes;
    removing the first dielectric layer exposed by the etching holes to form cavities;
    forming a second blocking layer on the first blocking layer, the second blocking layer sealing the etching holes on tops of the cavities;
    removing part of the first blocking layer in the first trenches to allow the first trenches to expose the substrate; and
    forming wires in the first trenches, the wires being electrically connected with the substrate.

2. The method according to claim 1, wherein the first dielectric layer exposed by the etching holes is removed by dry etching or wet etching.

3. The method according to claim 1, wherein the first dielectric layer is a silicon oxide layer, the support layer is a silicon nitride layer or a silicon oxynitride layer, and a ratio of a thickness of the first dielectric layer to a thickness of the support layer is greater than or equal to 2.

4. The method according to claim 1, wherein bottoms of the etching holes are located in the support layer.

5. The method according to claim 1, wherein the forming a support layer on a substrate, and forming a first dielectric layer on the support layer, the support layer and the first dielectric layer being formed with first trenches, and the first trenches exposing the substrate comprises:
    forming the support layer, the first dielectric layer, a hard mask layer, an anti-reflective layer and a first photoresist layer in sequence on the substrate;
    etching the anti-reflective layer and the hard mask layer by taking the first photoresist layer as a mask; and
    etching the first dielectric layer and the support layer by taking the etched anti-reflective layer and the etched hard mask layer as a mask to form the first trenches.

6. The method according to claim 1, wherein the etching the first blocking layer and the first dielectric layer to form etching holes comprises:
    forming a second photoresist layer on the first blocking layer and in the first trenches, the second photoresist layer filling the first trenches and covering a surface of the first blocking layer facing away from the substrate;
    etching the first blocking layer and the first dielectric layer by taking the second photoresist layer as a mask to form the etching holes; and
    removing the second photoresist layer.

7. The method according to claim 1, wherein the forming wires in the first trenches, the wires being electrically connected with the substrate comprises:
    depositing a conductive layer in the first trenches, the conductive layer filling the first trenches and covering a top surface of the second blocking layer; and
    removing the conductive layer on the second blocking layer, the remaining conductive layer forming the wires.

8. The method according to claim 7, wherein the conductive layer on the second blocking layer is removed by chemical mechanical polishing.

9. The method according to claim 7, wherein the conductive layer comprises a third blocking layer and a conductive material layer in a stacked arrangement, and the third blocking layer is located at a side of the conductive layer close to the substrate.

10. The method according to claim 1, wherein the forming a second blocking layer on the first blocking layer, the second blocking layer sealing the etching holes on tops of the cavities comprises:

forming the second blocking layer covering the first blocking layer, and the second blocking layer located in the first trenches enclosing second trenches.

11. The method according to claim 10, wherein the removing part of the first blocking layer in the first trenches to allow the first trenches to expose the substrate comprises:

removing the second blocking layer and the first blocking layer at bottoms of the second trenches, the second trenches exposing the substrate.

12. The method according to claim 11, wherein the removing the second blocking layer and the first blocking layer at bottoms of the second trenches, the second trenches exposing the substrate comprises:

forming a third photoresist layer on the second blocking layer, the third photoresist layer having first openings, an orthographic projection of the first openings on the substrate coinciding with an orthographic projection of the second trenches on the substrate; and etching the second blocking layer and the first blocking layer by taking the third photoresist layer as a mask.

13. The method according to claim 11, wherein the forming wires in the first trenches, the wires being electrically connected with the substrate comprises:

forming the wires in the second trenches, the wires filling the second trenches.

* * * * *